(12) United States Patent
Melzak et al.

(10) Patent No.: US 7,488,984 B2
(45) Date of Patent: Feb. 10, 2009

(54) DOPING OF SIC STRUCTURES AND METHODS ASSOCIATED WITH SAME

(75) Inventors: Jeffrey M. Melzak, Beachwood, OH (US); Chien-Hung Wu, Strongsville, OH (US)

(73) Assignee: FLX Micro, Inc., Cleveland, OH (US)

( * ) Notice: Subject to any disclaimer, the term of this patent is extended or adjusted under 35 U.S.C. 154(b) by 286 days.

(21) Appl. No.: 11/407,853

(22) Filed: Apr. 19, 2006

(65) Prior Publication Data

US 2007/0246786 A1 Oct. 25, 2007

(51) Int. Cl.
*H01L 29/15* (2006.01)
(52) U.S. Cl. .......... 257/77; 257/E21.054; 257/E21.065; 438/931
(58) Field of Classification Search .......... None
See application file for complete search history.

(56) References Cited

U.S. PATENT DOCUMENTS

| | | | | |
|---|---|---|---|---|
| 6,359,276 B1* | 3/2002 | Tu | ............................ | 250/338.1 |
| 2002/0096684 A1* | 7/2002 | Brandes et al. | ............... | 257/77 |
| 2003/0045120 A1* | 3/2003 | Hu et al. | ....................... | 438/745 |
| 2006/0008661 A1* | 1/2006 | Wijesundara et al. | ........ | 428/446 |
| 2006/0276027 A1* | 12/2006 | Lu et al. | ...................... | 438/622 |

* cited by examiner

*Primary Examiner*—Evan Pert
*Assistant Examiner*—Scott R Wilson
(74) *Attorney, Agent, or Firm*—DeMont & Breyer, LLC (57) ABSTRACT

Doped silicon carbide structures, as well as methods associated with the same, are provided. The structures, for example, are components (e.g., layer, patterned structure) in MEMS structures. The doped silicon carbide structures may be highly conductive, thus, providing low resistance to electrical current. An in-situ doping process may be used to form the structures. The process parameters can be selected so that the structures have a low residual stress and/or low strain gradient. Thus, the structures may be formed having desired dimensions with little (or no) distortion arising from residual stress and/or strain gradient. The high conductivity and mechanical integrity of the structures are significant advantages in MEMS devices such as sensors and actuators.

39 Claims, 9 Drawing Sheets

DOPING OF SIC STRUCTURES AND METHODS ASSOCIATED WITH SAME

FIELD OF INVENTION

The invention relates generally to doped silicon carbon structures and, more particularly, to doped silicon carbide structures that form components of MEMS structures and methods associated with the same.

BACKGROUND OF INVENTION

Microelectromechanical systems (MEMS) include mechanical and electrical components having dimensions on the order of microns or smaller. MEMS structures are used in numerous applications including sensors and actuators.

The micromechanical component(s) in a sensor typically move in response to a condition (e.g., pressure, flow, acceleration and stress, amongst others). The sensor generates an electrical signal proportional to the movement which may be processed to provide a measurement of the condition. Actuators typically function by receiving an electric signal which generates an electrostatic force that can cause micromechanical components to move. Because the operation of a MEMS structure involves conducting electrical charge and the movement of small mechanical parts, it is desirable for MEMS components to be conductive and have sufficient mechanical integrity during use.

MEMS structures may be formed using microelectronic fabrication processes. In a typical process, deposition steps are used to deposit layers which are subsequently patterned using lithographic and etching steps to form the desired mechanical and electrical components. Other conventional processing steps, such as ion implantation, may also be employed if necessary.

Because microelectronic fabrication processes can be used to form MEMS structures, mechanical and electrical components of the structures are oftentimes formed of silicon. However, one disadvantage of silicon-based MEMS structures is the loss of performance under extreme conditions such as high temperatures, corrosive environments, or rapid vibrations. Under such conditions, the mechanical properties of silicon may be degraded so that the mechanical components cannot perform their desired function. Also, silicon becomes extrinsic at temperatures above 150° C. and, thus, loses its ability to function as a semiconductor material at such temperatures.

SUMMARY OF INVENTION

Doped silicon carbide structures, as well as methods associated with the same, are provided. The structures may be components of MEMS structures.

In one aspect of the invention, MEMS structures are provided.

In one embodiment, the MEMS structure comprises a doped silicon carbide structure having a resistivity of less than about 0.1 Ohm-cm and a residual stress of less than about 200 MPa. The doped silicon carbide structure has a thickness between about 0.1 microns and about 20 microns.

In another embodiment, the MEMS structure comprises a doped silicon carbide structure having a resistivity of less than about 0.1 Ohm-cm and a residual strain gradient of less than about $10^{-4}$/micron. The doped silicon carbide structure has a thickness between about 0.1 microns and about 20 microns.

In another embodiment, the MEMS structure comprises a doped silicon carbide structure having a residual stress of less than about 200 MPa and a residual strain gradient of less than about $10^{-4}$/micron. The doped silicon carbide structure has a thickness between about 0.1 microns and about 20 microns.

In another aspect of the invention, methods of forming MEMS structures are provided.

In one embodiment, the method comprises reacting a silicon source and a carbon source in the presence of a dopant source to form a first portion of a doped silicon carbide structure in a reaction chamber. The method further comprises changing process conditions to grow a second portion of the doped silicon carbide structure that reduces the residual stress and residual strain gradient in the doped silicon carbide structure.

Other aspects, embodiments and features of the invention will become apparent from the following detailed description of the invention when considered in conjunction with the accompanying drawings. All patent applications and patents incorporated herein by reference are incorporated by reference in their entirety. In case of conflict, the present specification, including definitions, will control.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

The invention provides doped silicon carbide structures, as well as methods associated with the same. The structures, which may be doped either n-type or p-type, for example, can form components (e.g., layers, patterned structures) in MEMS structures. The doped silicon carbide structures may be highly conductive, thus, providing low resistance to electrical current. An in-situ doping process may be used to form the structures. The process parameters can be selected so that the structures have a low residual stress and/or low residual strain gradient, as described further below. Thus, the structures may be formed having desired dimensions with little (or no) distortion arising from residual stress and/or residual strain gradients. The high conductivity and mechanical integrity of the structures are significant advantages in MEMS applications such as sensors and actuators.

Figure 1:
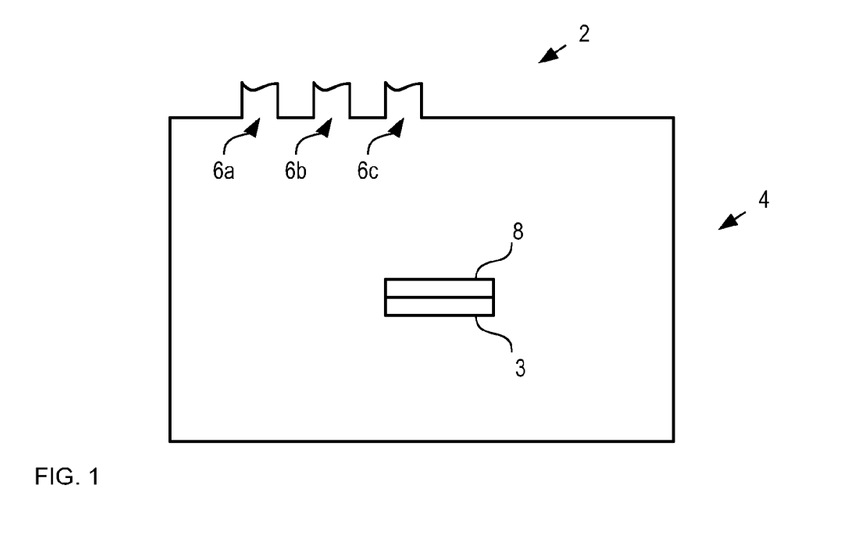
FIG. 1 shows a system suitable for forming the silicon carbide structures according to embodiments of the invention.

In one embodiment, the method of forming the silicon carbide structure involves depositing a doped silicon carbide layer on a substrate. For example, a chemical vapor deposition (CVD) process may be used to deposit the silicon carbide layer. FIG. 1 schematically illustrates a system 2 suitable for forming the silicon carbide structures of the invention. In a typical process, a substrate 3 is placed in a reaction chamber 4 into which a silicon source gas and a carbon source gas are introduced through respective inlets 6a, 6b. In methods of the invention, a dopant source is also introduced into the chamber through an inlet 6c at, or about, the same time as the silicon and carbon source gases. The silicon and carbon source gases react in the presence of the dopant to form a doped silicon carbide layer 8 on the substrate. Process conditions (e.g., source flow rate, temperature, and pressure) are controlled to deposit doped silicon carbide having the desired properties (e.g., high conductivity, low residual stress, low strain gradient), as described further. For example, in some methods, process conditions may be changed during deposition to reduce the residual stress and residual strain gradient in the resulting layer.

It should also be understood that it may be possible to form a mixture of two or more of the source gases prior to introduction into the chamber. In these embodiments, the system may be modified to include a single inlet or two inlets.

Any suitable substrate may be used in the deposition process. Typical substrate materials include silicon, silicon-on-insulator (SOI), silicon-on-sapphire (SOS), and silicon carbide-based substrates (e.g., silicon carbide and silicon carbide-on-insulator), amongst others. In some embodiments, for example when the silicon carbide structure forms a component of a MEMS structure to be used at high temperatures, it may be preferable to deposit the silicon carbide layer on a silicon carbide-based substrate. Silicon carbide-based substrates can be used in MEMS structures at higher temperatures (e.g., up to about 600° C.) than other substrates such as silicon.

The deposition process may use any suitable silicon and carbon sources. In some methods, the silicon source is dichlorosilane (DCS) and the carbon source is acetylene ($C_2H_2$). The sources may be mixed with a diluent gas (such as hydrogen) which can lead to increased control over flow rate, amongst other advantages.

The dopant source gas depends on the type of dopant used in the process. N-type dopants for silicon carbide include Group V elements such as nitrogen or phosphorous. Suitable n-type dopant source gases are ammonia ($NH_3$), nitrogen ($N_2$) and phosphine ($PH_3$), amongst others.

P-type dopants for silicon carbide include Group III elements such as boron and aluminum. Suitable p-type dopant source gases are diborane ($B_2H_6$), boron tribromide ($BBr_3$) and trimethyl aluminum (TMA), amongst others. In some cases, the dopant gas may also be mixed with a diluent gas such as hydrogen.

It should be understood that other suitable n-type or p-type source gases may be used.

The flow rate of silicon, carbon and dopant source gases are controlled within desired ranges to provide suitable deposition conditions. For example, the flow rate of the silicon source gas (e.g., DCS) may be between about 20 and about 60 sccm (i.e., cubic centimeter per minute at 300 K, 1 atm) and, in some embodiments, between about 35 and about 50 sccm.

The flow rate of the carbon source gas (e.g., acetylene) may be between about 5 and about 15 sccm. The flow rate of the dopant source gas (e.g., nitrogen) may be between about 0.10 and about 5.0 sccm; and, in some cases, between about 0.1 and 2.0 sccm.

The above flow rates are based on carbon, silicon and dopant flow rates and do not take into account the diluent gas (if present). It should also be understood that other flow rates may also be suitable.

Typical temperature conditions within chamber 4 during the deposition step are between about 650° C. and 950° C. In some methods, reaction temperatures between about 800° C. and 900° C. may be preferred.

In some embodiments, the pressure in reaction chamber 4 may be between about 0.5 and 5.0 Torr.

Figure 2:
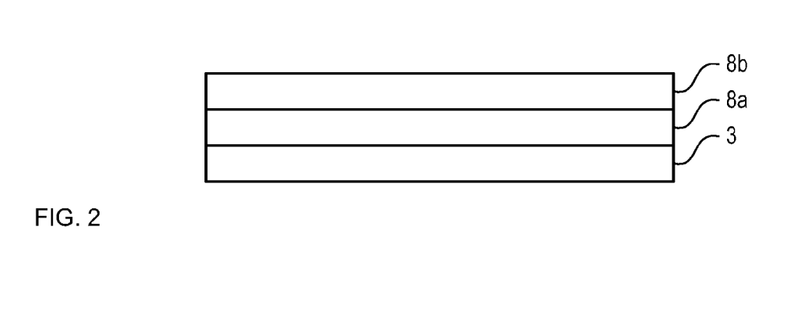
FIG. 2 shows a silicon carbide structure according to an embodiment of the invention.

As noted above, it has been discovered that changing process conditions during deposition can reduce the residual stress and/or strain gradient in silicon carbide layer 8 as shown in FIG. 2. In such methods, a first portion 8a of the silicon carbide layer may be deposited at a first set of process conditions. The process conditions may be changed to a second set of process conditions to deposit a second portion 8b of the silicon carbide layer. The first and second portions typically have different stress/strain gradient characteristics and the respective process conditions are selected such that the stress/strain gradient characteristics of the first portion balance the stress/strain gradient characteristics in the second portion in a manner that results in a low residual stress and strain gradient in the resulting layer.

Figure 3A:
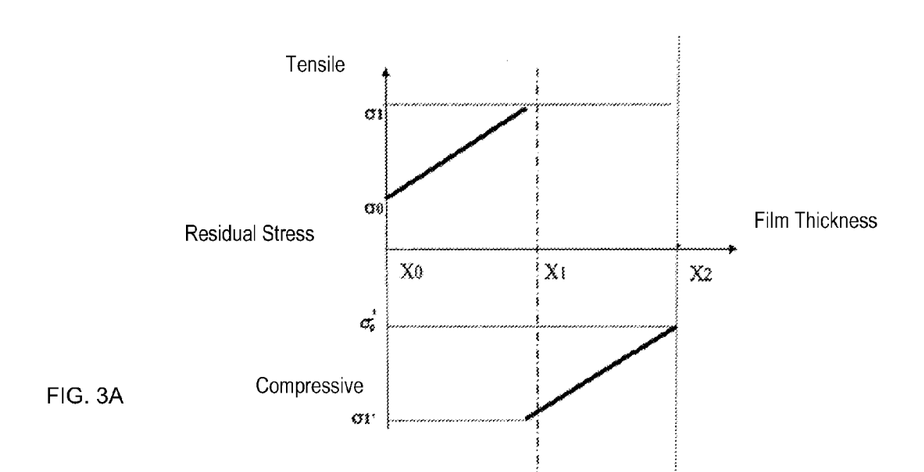
FIGS. 3A and 3B respectively illustrate a schematic stress profile and schematic bending moment profile of a silicon carbide layer according to an embodiment of the invention.
Figure 3B:
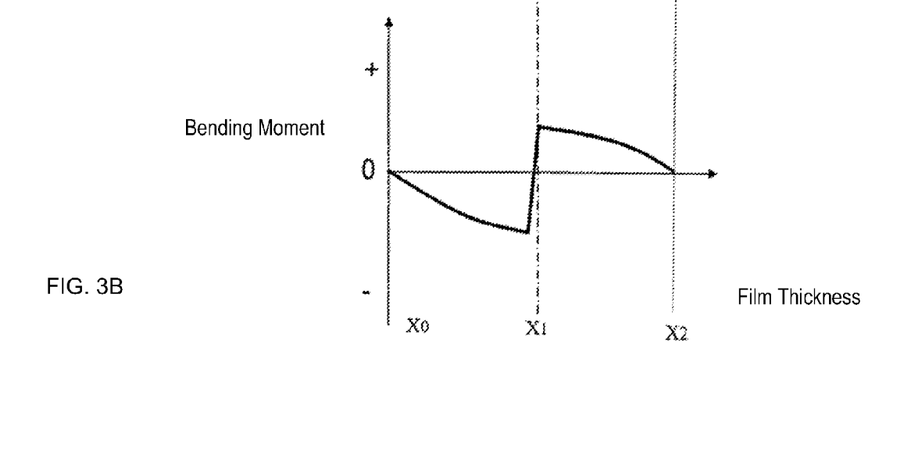

In one set of embodiments, for example, first portion 8A is under tensile stress ($\sigma$), while second portion 8B is under compressive stress ($\sigma'$). The compressive stress in the second portion may be selected to balance the tensile stress in the first portion. FIGS. 3A and 3B respectively illustrate a schematic stress profile and schematic bending moment profile of such a silicon carbide layer. As shown in FIGS. 3A and 3B, the tensile stress in the first portion is balanced by the compressive stress in the second portion. In FIG. 3B, a bending moment of zero means a strain gradient of zero—a condition met at a film thickness of $X_2$.

Figure 4A:
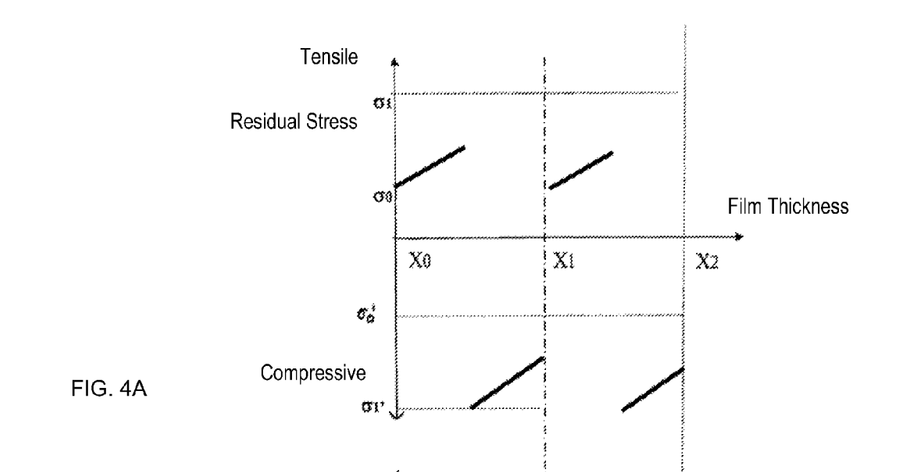
FIGS. 4A and 4B respectively illustrate a schematic stress profile and schematic bending moment profile of a silicon carbide layer according to an embodiment of the invention.
Figure 4B:
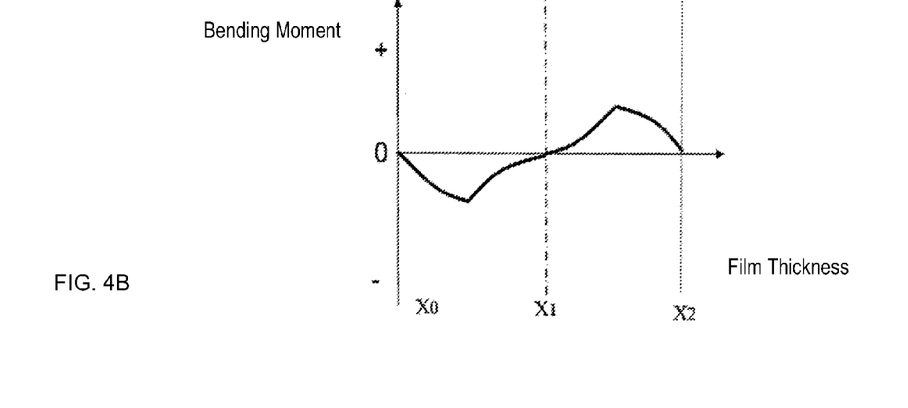

In some methods, the process conditions can be changed more than once during the deposition to form more than two portions of the layer (e.g., 4 portions). It should be understood that the process conditions may be changed as many times as desired. In some of these embodiments, it is preferable for the silicon carbide layer to include alternating portions under tensile and compressive stresses. For example, a first portion of the silicon carbide layer may be under tensile stress, a second portion under compressive stress, a third portion under tensile stress, and a fourth portion under compressive stress. FIGS. 4A and 4B respectively illustrate a schematic stress profile and schematic bending moment profile of such a silicon carbide layer. As shown in FIGS. 4A and 4B, the tensile stresses in the first and third portions are respectively balanced by the compressive stress in the second and fourth portions.

It should be understood that the stress and bending moment profiles shown herein are non-limiting examples and that silicon carbide layers of the invention may have other stress and bending moment profiles.

In some methods, the flow rate of at least one of the source gases may be changed to provide a desired residual stress and/or strain gradient in the resulting silicon carbide layer. It may be preferred to change the flow rate of at least one of the source gases so that the ratio of source gas flow rates is changed (e.g., ratio of silicon source gas flow rate to carbon source gas flow rate). Changing the flow rate of the silicon source gas (e.g., DCS), while maintaining the flow rates of the other source gases, has been shown to be particularly effective in controlling residual stress and/or strain gradient.

The flow rate of at least one of the source gases may be changed from a first flow rate (resulting in a first source gas flow rate ratio) used to deposit the first portion to a second flow rate (resulting in a second source gas flow rate ratio) used to deposit the second portion. The first flow rate (and source gas flow rate ratio) may result in deposition of the first portion under tensile stress; while, the second flow rate (and source gas flow rate ratio) may result in deposition of the second portion under compressive stress. This transition from tensile stress to compressive stress can occur at a critical flow rate (and source gas flow rate ratio) with the first flow rate (and first source gas flow rate ratio) being less than the critical flow rate and the second flow rate (and second source gas flow rate ratio) being greater than the critical flow rate.

The specific flow rates and source gas flow rate ratios depend, in part, on the specific process including other process conditions. When the silicon source gas (e.g., DCS) is changed, for example, the first flow rate may be between about 25 sccm and about 45 sccm and the first flow rate ratio of silicon source gas-to-carbon source gas may be between about 2.7 and about 5.0; while, the second flow rate may be between about 35 sccm and about 55 sccm and the second flow rate ratio of silicon source gas-to-carbon source gas may be between about 3.8 and about 6.1. In these embodiments, the second flow rate is greater than the first flow rate and the second flow rate ratio of silicon source gas-to-carbon source gas is greater than the first ratio. In these embodiments, the transition from tensile to compressive stress may be at a flow rate of between about 35 sccm and about 45 sccm, and at a silicon source gas-to-carbon source gas flow rate ratio of between about 3.8 and about 5.0. These values depend, in part, on other processing conditions. For example, in some embodiments, suitable pressures are between about 1 and 3 Torr and suitable temperatures between about 800° C. and 900° C.

It should be understood that the source gas flow rate(s) may be changed as many times as desired during deposition to form a layer having desired stress/strain gradient conditions, as described above.

In some methods, the pressure in the reaction chamber may be changed to reduce the residual stress and/or residual strain gradient in the resulting silicon carbide layer. The pressure may be changed from a first pressure used to deposit the first portion to a second pressure used to deposit the second portion. The first pressure may result in deposition of the first portion under tensile stress; while, the second pressure may result in deposition of the second portion under compressive stress. This transition from tensile stress to compressive stress can occur at a critical pressure with the first pressure being less than the critical pressure and the second pressure being greater than the critical pressure.

The specific pressures depend, in part, on the specific process including other process conditions. For example, the first pressure may be between about 0.2 Torr and about 2.5 Torr and the second pressure may be between about 1.5 Torr and about 5.0 Torr, with the second flow rate being greater than the first flow rate. In these embodiments, the transition from tensile to compressive stress may be between about 1.5 Torr and about 2.5 Torr depending, in part, on the other conditions.

It should be understood that, in certain methods of the invention, process conditions other than the source gas flow rate and pressure (e.g., temperature) may be changed to reduce the residual stress and strain gradient in the resulting layer.

Advantageously, the methods of the invention do not require an annealing step after the deposition process to achieve the low resistivities, low residual stress and low residual strain gradients. Thus, the silicon carbide layers may be unannealed. Removing an annealing step can lower the overall thermal budget of the process which can be important. In methods of the present invention, these characteristics may result from the deposition process, itself. In some embodiments, an annealing step may be utilized. Advantageously, the doped silicon carbide structures may maintain their mechanical properties and stability even at high annealing temperatures (e.g., 400-1300° C.). The mechanical properties and stability may also be maintained in the doped silicon carbide structures at high operating temperatures (e.g., 400-1300° C.).

The resulting silicon carbide layer may have any suitable thickness which is, in part, selected based on the application. Typical thicknesses are between about 0.1 microns and about 20 microns, though other thicknesses are also possible.

The presence of the dopant increases the conductivity of the silicon carbide layer. In some methods, the doping level may be greater than about $10^{20}$ cm$^{-3}$ (e.g., between $10^{20}$ cm$^{-3}$ and $10^{22}$ cm$^{-3}$). The specific doping level depends on the desired conductivity and can be controlled, in part, by the dopant source gas flow rate. It is possible to produce relatively uniform doping profile across the thickness of the silicon carbide layer.

The doped silicon carbide layers can be highly conductive and, thus, have low resistivities. For example, the resistivity of the layers may be less than about 0.1 Ohm-cm. In some embodiments, the resistivity of the layers may be less than about 0.02 Ohm-cm. In some methods, it may not be preferable to achieve layer resistivities of less than about 0.001 Ohm-cm because of difficulties in achieving sufficient doping levels and other reasons. The resistivity of the silicon carbide layers may be measured using known techniques such as 4-point probe measurements.

As noted above, the silicon carbide layers of the invention may have a low residual stresses. For example, the residual stress may be less than about 200 MPa, or less than about 50 MPa. In some embodiments, the residual stress may be about 0. The residual stress may either be in the form of a tensile stress or a compressive stress. It should be understood that the convention used herein is to treat all non-zero stress values as positive values whether the stress is a compressive stress or a tensile stress (rather than treating compressive stress as a negative stress value). It may be preferable in certain embodiments for the layer to have a small amount of residual tensile stress (e.g., between about 0 and 100 MPa tensile stress, or between about 0 and 50 MPa tensile stress).

As described above, a layer may have a number of stress conditions (e.g., different portions of the layer being under different amounts and/or types of stress) that may contribute to the residual stress. Residual stress may be measured using known techniques including wafer curvature techniques. Wafer curvature techniques, for example, may determine the radius of curvature of a wafer (e.g., using laser interferometry) and use Stoney's equation to determine the residual stress as known to those of ordinary skill in the art. Suitable wafer curvature instruments include the FSM-128, manufactured by Frontier Semiconductor Measurements Inc, (San Jose, Calif.; www.frontiersemi.com); and, the FLX-2320 manufactured by KLA-Tencor (San Jose, Calif.; www.kla-tencor.com).

The silicon carbide layers of the invention may also have low residual strain gradients. For example, the residual strain gradient may be less than about $10^{-4}$/micron, or even less than about $10^{-5}$/micron. In some embodiments, the residual strain gradient may be greater than about $10^{-6}$/micron. It should be understood that the convention used herein is to treat all non-zero residual strain gradient values as positive values whether the strain gradient is a compressive strain gradient or a tensile strain gradient (rather than treating compressive strain gradient as a negative strain gradient).

As described above, a layer may have a number of strain gradients (e.g., different portions of the layer having different amounts and/or types of strain gradients) that may contribute to the residual strain gradient. Residual strain gradient may be measured using known techniques. One suitable technique involves measuring (e.g., using a surface profilometer) the out-of-plane deflection of a cantilever structure having known dimensions and calculating the residual strain gradient. The cantilever structure, for example, may have the following dimensions: thickness between about 2 and 4 microns; width about 10 microns, and length between about 100 microns and 1000 microns. The residual strain gradient may be calculated from the out-of-plane deflection divided by the length squared. One suitable profilometer is the NT-3300 profilometer manufactured by Veeco Instruments Inc. (Woodbury, N.Y.; www.veeco.com).

It should be understood that silicon carbide layers of the invention may have any combination of the conductivity, residual stress and residual strain gradient values noted above. However, in some embodiments, the layers do not exhibit the above-noted values for all of the properties.

In certain preferred embodiments, the doped silicon carbide layer is formed of polycrystalline silicon carbide. Polycrystalline structures include a plurality of randomly oriented crystallites which is different than a single crystal structure. Polycrystalline silicon carbide may be deposited at lower temperatures than single crystal silicon carbide which can be advantageous. The polycrystalline silicon carbide may have a face centered cubic (zinc blende) structure (i.e., Beta phase).

The doped silicon carbide layers may be processed to form desired structures. In certain preferred embodiments, the structures are processed to form components in MEMS structures. A wide variety of different designs of the components may be used in MEMS structures of the present invention and the specific design of the components depends on the application of the MEMS structure. Oftentimes, the doped silicon carbide layers may be processed to form, at least part, of the micromechanical components of a MEMS structure. The micromechanical components include at least one, and in some cases more than one, moveable component. Typical examples of the moveable component include diaphragms, floating plates and beams, amongst others.

Figure 5:
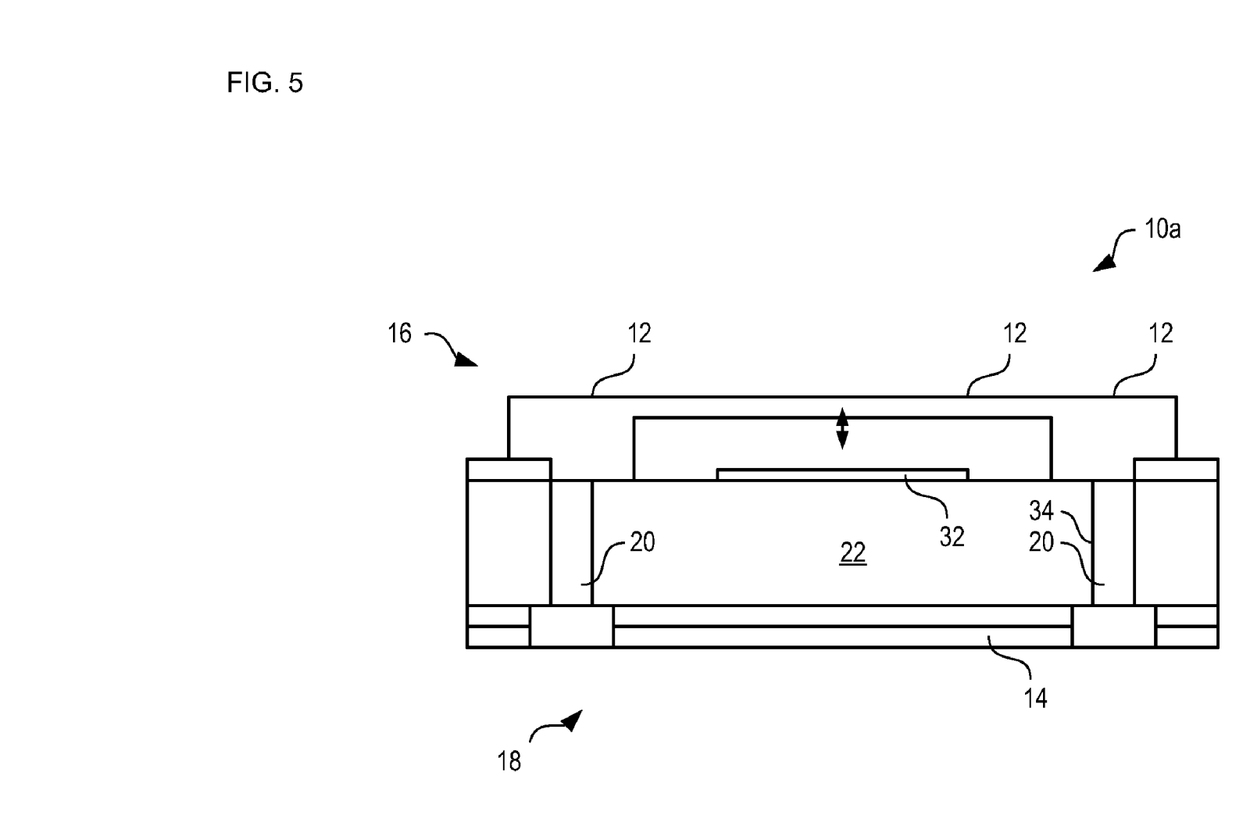
FIG. 5 shows a cross-section of a microsensor including components formed of doped silicon carbide according to an embodiment of the present invention.
Figure 6:
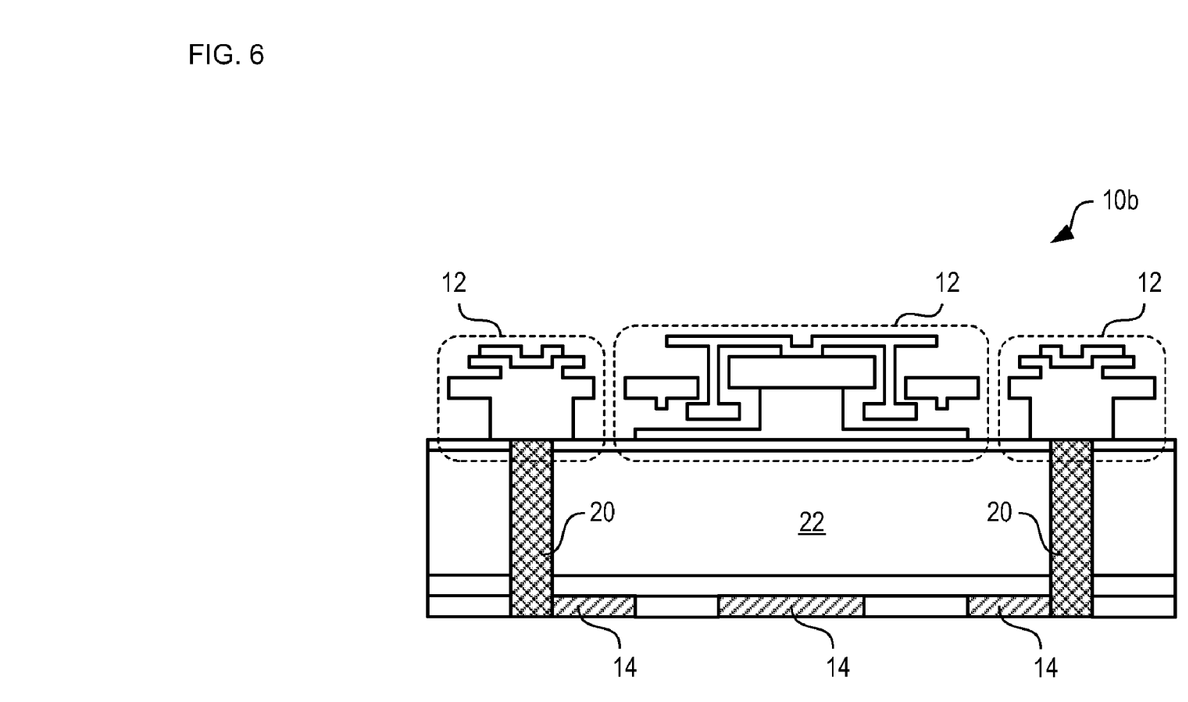
FIG. 6 shows a cross-section of a microactuator including components formed of doped silicon carbide according to an embodiment of the present invention.

FIGS. 5 and 6 show respective MEMS structures 10A and 10B according to embodiments of the present invention. MEMS structure 10A in FIG. 5 is a microsensor and MEMS structure 10B in FIG. 6 is a microactuator. It should be understood that any suitable MEMS structure is embraced by the invention including microsensors and microactuators having different structures than those illustrated herein, as well as other types of MEMS devices.

The illustrative MEMS structures include micromechanical components 12 formed of doped silicon carbide. The micromechanical components may be integrated with electronic components 14 on the same structure in these embodiments, though it should be understood that the micromechanical components are not integrated with electronic components on the same structure in other embodiments. As shown, the micromechanical components are formed on a frontside 16 of the structure and the electronic components are formed on a backside 18 of the structure. Electrical connections 20 may be formed in vias 34 that extend through a substrate 22 to connect the micromechanical components and the electronic components, thus, enabling electrical signals to pass therebetween.

Advantageously, the micromechanical components are formed of doped silicon carbide which may have low resistivity as described above. The low resistivity enables the MEMS structures to operate at low actuation voltages, amongst other advantages.

Also, the micromechanical components may be formed of silicon carbide having low residual stress and/or residual strain gradients. In these cases, the components may retain their desired dimensions, instead of being distorted (e.g., bent out of plane, expanded, shrunk) which commonly occurs in conventional structures in response to stress and/or strain gradients. Thus, doped silicon carbide components of the invention may be used in MEMS applications requiring tight dimensional control. For example, the comb fingers and suspension beams of a comb-drive lateral resonator may be formed of doped silicon carbide.

The silicon carbide layers may be processed to form MEMS structures using known techniques. Suitable techniques have been generally described in commonly-owned, co-pending U.S. Patent Publication No. 20060027884, which is based on U.S. patent application Ser. No. 10/914,468, filed Aug. 9, 2004, which is incorporated herein by reference.

Micromechanical components 12 may be formed from one or more doped silicon carbide layers using a variety of techniques including etching (e.g., reactive ion etching), micromolding and lift-off.

Micromolding involves the deposition of a series of doped silicon carbide layers which are patterned to form the desired structures using sacrificial mold layers (e.g., formed of polysilicon or silicon oxide), as described further below. The sacrificial mold layers are removed to release the doped silicon carbide patterned structures thereby forming the micromechanical components.

One example of a typical micromolding process is illustrated with reference to the cross-sections shown in FIGS. 7A-7J. Those of ordinary skill in the art would understand variations to the illustrated micromolding process which are intended to be within the scope of the present invention.

Figure 7A:
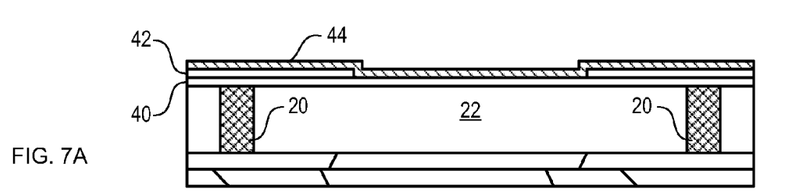
FIGS. 7A-7J are respective cross-sections of a structure at different stages during the formation of micromechanical components of doped silicon carbide according to an embodiment of the present invention.

FIG. 7A illustrates a cross-section of the structure after the following steps: deposition of a nitride layer 40 on substrate 22, deposition and patterning of a silicon oxide layer 42 on the nitride layer, and deposition of a doped silicon carbide layer 44 on the silicon oxide layer. The nitride layer and silicon oxide layer may, for example, be deposited using conventional chemical vapor deposition techniques. The doped silicon carbide layer may be deposited using the processes described above.

Figure 7B:
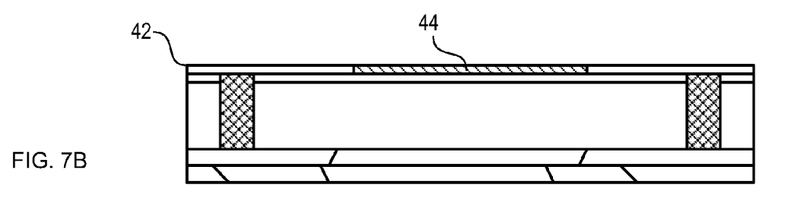

FIG. 7B illustrates a cross-section of the structure after a planarization step in which doped silicon carbide layer 44 is polished to be co-planar with patterned silicon oxide layer 42. Polishing may be accomplished using a chemical-mechanical polishing technique.

Figure 7C:
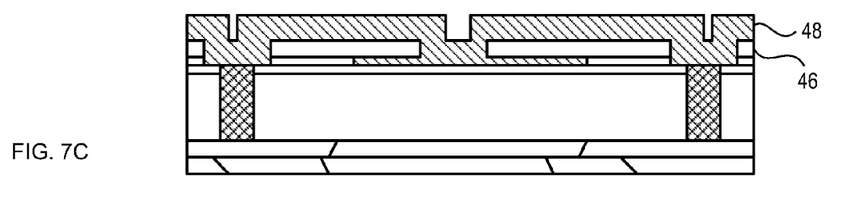

FIG. 7C illustrates a cross-section of the structure after the following steps: deposition and patterning of a second silicon oxide layer 46 on the planarized surface and deposition of a second doped silicon carbide layer 48 on the patterned second silicon oxide layer. The second silicon oxide layer may be deposited using conventional chemical vapor deposition techniques. The second doped silicon carbide layer may be deposited using the processes described above and may have a thickness, for example, between about 1.0 micron and about 5.0 microns (e.g., about 2.0 microns).

Figure 7D:
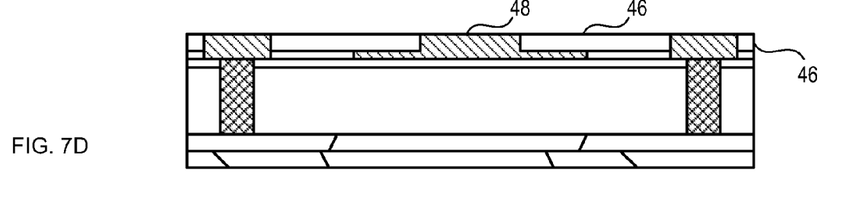

FIG. 7D illustrates a cross-section of the structure after a planarization step in which second doped silicon carbide layer 48 is polished to be co-planar with the patterned second silicon oxide layer 46. Polishing may be accomplished using a chemical-mechanical polishing technique.

Figure 7E:
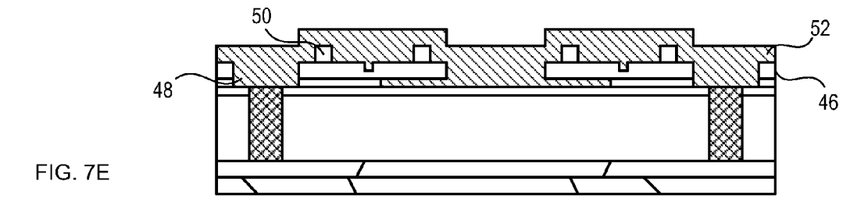

FIG. 7E illustrates a cross-section of the structure after the following steps: etching dimples in the second silicon oxide layer, deposition and patterning of a polysilicon layer 50, and deposition of a third doped silicon carbide layer 52 on the patterned polysilicon layer. The polysilicon layer may, for example, be deposited using conventional chemical vapor deposition techniques. The third doped silicon carbide layer may be deposited using the processes described above and may have a thickness, for example, between about 1.0 micron and about 5.0 microns (e.g., about 2.0 microns).

Figure 7F:
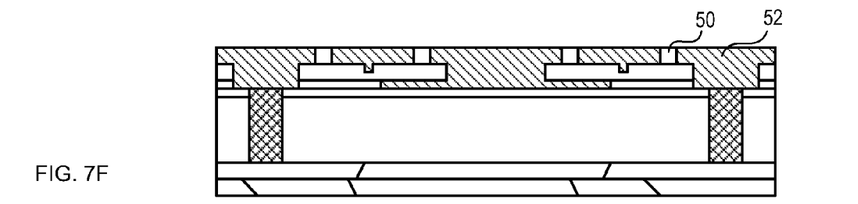

FIG. 7F illustrates a cross-section of the structure after a planarization step in which third doped silicon carbide layer 52 is polished to be co-planar with the patterned polysilicon layer 50. Polishing may be accomplished using a chemical-mechanical polishing technique.

Figure 7G:
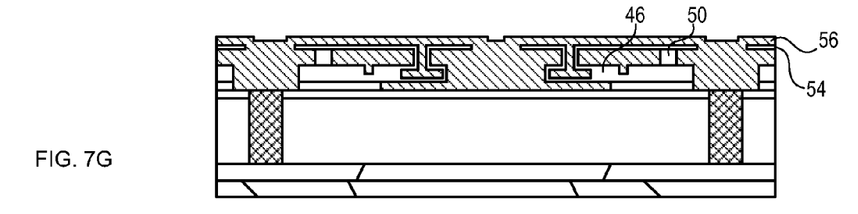

FIG. 7G illustrates a cross-section of the structure after the following steps: etching vias that extend through patterned polysilicon layer 50 and into second silicon oxide layer 46, deposition and patterning of a third silicon oxide layer 54, deposition of a fourth doped silicon carbide layer 56. The third silicon oxide layer may, for example, be deposited using conventional chemical vapor deposition techniques. The fourth doped silicon carbide layer may be deposited using the processes described above. The third silicon oxide layer may have a thickness, for example, between about 0.5 microns and about 1.0 micron (e.g., 0.75 microns). The fourth doped silicon carbide layer may have a thickness, for example, between about 1.0 micron and about 5.0 microns (e.g., 1.5 microns).

Figure 7H:
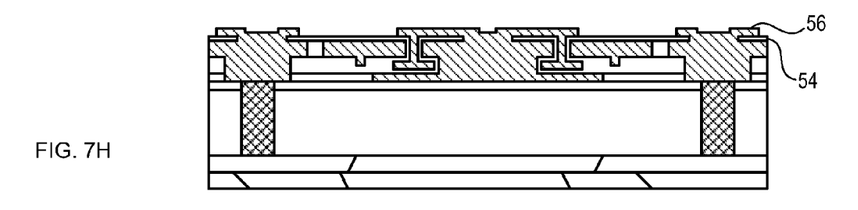

FIG. 7H illustrates a cross-section of the structure after the fourth silicon carbide layer has been patterned. The fourth doped silicon carbide layer may be patterned, for example, using reactive ion etching (RIE).

Figure 7I:
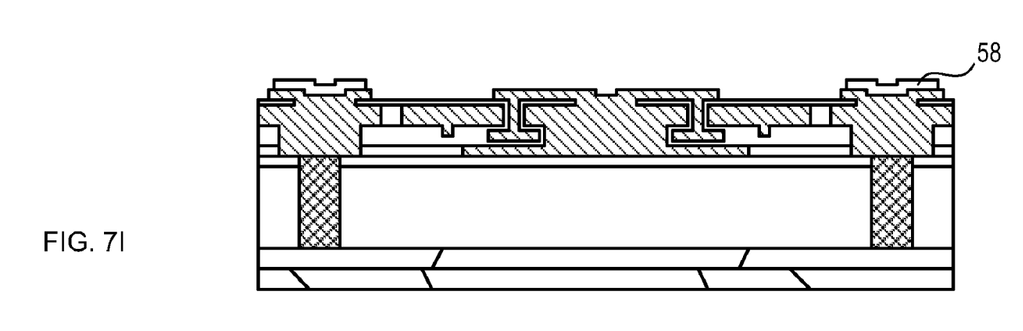

FIG. 7I illustrates a cross-section of the structure after deposition and patterning of a metal layer 58 on the patterned fourth doped silicon carbide layer. The metal layer may be formed of nickel. The thickness of the metal layer may be, for example, between about 0.5 microns and about 1.0 micron (e.g., 0.75 microns).

Figure 7J:
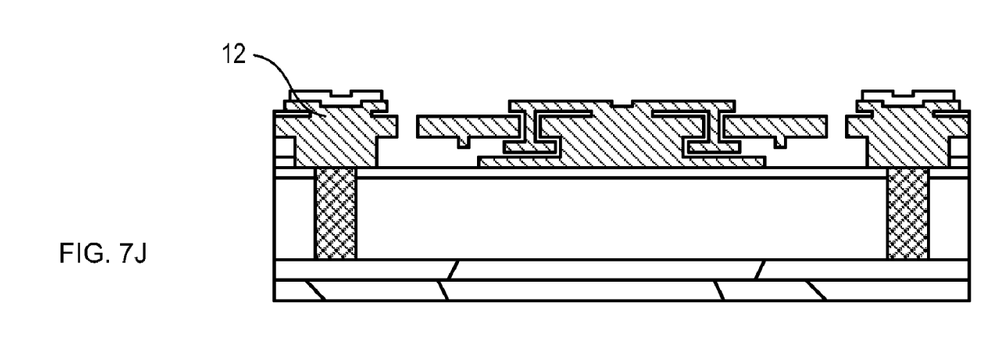

FIG. 7J illustrates a cross-section of the structure after the silicon oxide layers (42, 46, 54) and the polysilicon layer (50) have been removed, for example, using an etching technique. The remaining doped silicon carbide and nickel structures form micromechanical components 12.

It should be understood that micromechanical components having a structure different than those illustrated in FIGS. 7A-7J may also be formed using micromolding processes and that the process steps could be modified accordingly. Also, it should be understood that processes other than micromolding (e.g., deposition and etching) may be used to form the micromechanical components of the invention.

The following example is not limiting and is meant to be illustrative of certain embodiments of the invention.

EXAMPLE

This example illustrates production and characterization of doped silicon carbide structures of the present invention. In some cases, the doped silicon carbide structures are compared to un-doped silicon carbide structures.

A CVD process similar to the one described above was used to form in-situ doped silicon carbide layers on a 4-inch silicon substrate. The doped layers had a first portion (under tensile) and a second portion (under compression). A similar CVD process was used to deposit an un-doped silicon carbide layer on a 4-inch silicon substrate, except that a dopant source gas was not introduced into the reaction chamber.

Resistivity of the doped silicon carbide layers and the un-doped silicon carbide layers was measured. The un-doped silicon carbide layers had a resistivity of between about 2 Ohm-cm and about 20 Ohm-cm. The doped silicon carbide layers had a resistivity of less than about 0.20 Ohm-cm and down to 0.10 Ohm-cm.

SIMS analysis was conducted on the doped silicon carbide layers and indicated that the dopant concentration was about $10^{21}$ cm$^{-3}$ and that the dopant profile was relatively uniform throughout the film thickness.

X-ray photoelectron spectroscopy (XPS) was conducted on the doped silicon carbide layers and confirmed that the layer remained stoichiometric silicon carbide.

Residual stress of a number of the doped silicon carbide layers was measured to be in the range of 100 MPa tensile to 200 MPa compressive using a FSM-128 waver curvature instrument, manufactured by Frontier Semiconductor Measurements Inc.

Figure 8:
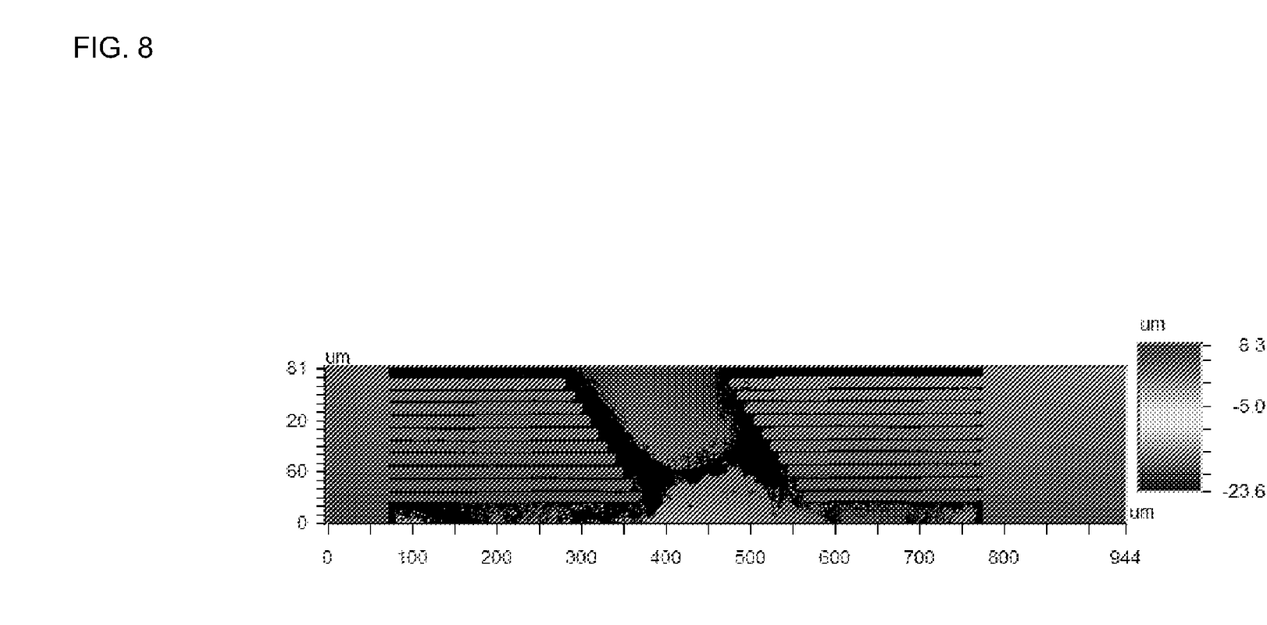
FIG. 8 shows a surface profile image of the doped silicon carbide structure described in the Example.

Residual strain gradient of the doped silicon carbide layers and un-doped silicon carbide layers was determined by machining cantilevers from the layers which were characterized using a surface profilometer technique. The doped silicon carbide films exhibited substantially similar residual strain gradients as the un-doped layers and, specifically, values in the range of $10^{-5}$/micron to $10^{-4}$/micron. FIG. 8 shows a surface profile image of the doped silicon carbide cantilevers having a low stress gradient.

This example establishes that methods of the invention may be used to form doped silicon carbide structures having a low resistivity, low residual stress and low residual strain gradient. The example also establishes that the structures are also suitable in MEMS device applications.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A MEMS structure comprising:
   a doped silicon carbide structure having a resistivity of less than about 0.1 Ohm-cm and a residual stress of less than about 200 MPa, wherein the doped silicon carbide structure has a dopant concentration of greater than $10^{20}$ cm$^{-3}$, and wherein the doped silicon carbide structure has a thickness between about 0.1 microns and about 20 microns.

2. The structure of claim 1, wherein the doped silicon carbide structure has a resistivity of less than about 0.05 Ohm-cm.

3. The structure of claim 1, wherein the doped silicon carbide structure has a polycrystalline structure.

4. The structure of claim 1, wherein the doped silicon carbide structure has a residual stress of less than about 50 MPa.

5. The structure of claim 1, wherein the doped silicon carbide structure has a residual strain gradient of less than about $10^{-4}$/micron.

6. The structure of claim 1, wherein the doped silicon carbide structure includes a first portion having a first stress and a second portion formed on the first portion, having a second stress.

7. The structure of claim 6, wherein the first stress is a tensile stress and the second stress is a compressive stress.

8. The structure of claim 1, wherein the doped silicon carbide structure has a residual tensile stress between about 0 and about 50 MPa.

9. The structure of claim 1, wherein the doped silicon carbide structure has a residual compressive stress.

10. The structure of claim 1, wherein the MEMS structure is a sensor.

11. The structure of claim 1, wherein the MEMS structure is an actuator.

12. The structure of claim 1, wherein the doped silicon carbide structure is formed on a substrate.

13. The structure of claim 1, wherein the doped silicon carbide structure is patterned.

14. A MEMS structure comprising:
a doped silicon carbide structure having a resistivity of less than about 0.1 Ohm-cm and a strain gradient of less than about $10^{-4}$/micron, wherein the doped silicon carbide structure has a dopant concentration of greater than $10^{20}$ cm$^{-3}$, and wherein the doped silicon carbide structure has a thickness between about 0.1 microns and about 20 microns.

15. The structure of claim 14, wherein the doped silicon carbide structure has a resistivity of less than about 0.05 Ohm-cm.

16. The structure of claim 14, wherein the doped silicon carbide structure has a polycrystalline structure.

17. The structure of claim 14, wherein the doped silicon carbide structure has a residual stress of less than about 200 MPa.

18. The structure of claim 14, wherein the doped silicon carbide structure has a residual strain gradient of less than about $10^{-5}$/micron.

19. The structure of claim 14, wherein the doped silicon carbide structure is patterned.

20. A MEMS structure comprising:
a doped silicon carbide structure having a residual stress of less than about 200 MPa and a strain gradient of less than about $1\times10^{-4}$/micron, wherein the doped silicon carbide structure has a thickness between about 0.1 microns and about 20 microns.

21. The structure of claim 20, wherein the doped silicon carbide structure has a resistivity of less than about 0.1 Ohm-cm.

22. The structure of claim 20, wherein the doped silicon carbide structure has a polycrystalline structure.

23. The structure of claim 20, wherein the doped silicon carbide structure has a dopant concentration of greater than $10^{20}$ cm$^{-3}$.

24. The structure of claim 20, wherein the doped silicon carbide structure has a residual stress of less than about 50 MPa.

25. The structure of claim 20, wherein the doped silicon carbide structure has a residual strain gradient of less than about $10^{-5}$/micron.

26. The structure of claim 20, wherein the doped silicon carbide structure is patterned.

27. A process for forming a MEMS structure comprising:
reacting a silicon source and a carbon source in the presence of a dopant source to form a first portion of a doped silicon carbide structure in a reaction chamber; and
changing process conditions in the reaction chamber to form a second portion of the doped silicon carbide structure that reduces the residual stress and/or residual strain gradient in the doped silicon carbide structure.

28. The process of claim 27, wherein changing process conditions comprises changing the pressure in the reaction chamber.

29. The process of claim 28, wherein changing process conditions comprises increasing the pressure in the reaction chamber.

30. The process of claim 27, wherein changing process conditions comprises changing the flow rate of at least one of the silicon source and the carbon source to the reaction chamber.

31. The process of claim 30, wherein changing process conditions comprises increasing the flow rate of at least one of the silicon source and the carbon source to the reaction chamber.

32. The process of claim 31, wherein the flow rate of at least one of the silicon source and the carbon source to the reaction chamber is increased from a first flow rate between about 25 sccm and about 45 sccm to a second flow rate between about 35 sccm and about 55 sccm.

33. The process of claim 30, wherein changing process conditions comprises changing the flow rate of the silicon source to the reaction chamber.

34. The process of claim 27, wherein changing process conditions comprises changing the ratio of source gas flow rates.

35. The process of claim 27, wherein the doped silicon carbide structure has a resistivity of less than about 0.1 Ohm-cm.

36. The process of claim 27, wherein the doped silicon carbide structure has a residual stress of less than about 200 MPa.

37. The process of claim 27, wherein the doped silicon carbide structure has a strain gradient of less than about $10^{-5}$/micron.

38. The process of claim 27, wherein the doped silicon carbide structure has a polycrystalline structure.

39. The process of claim 27, further comprising forming a micromechanical component from the doped silicon carbide structure.

* * * * *